United States Patent [19]
Sundaresan

[11] Patent Number: 6,107,642
[45] Date of Patent: *Aug. 22, 2000

[54] SRAM CELL WITH THIN FILM TRANSISTOR USING TWO POLYSILICON LAYERS

[75] Inventor: Ravishankar Sundaresan, Plano, Tex.

[73] Assignee: Chartered Semiconductor Manufacturing Company, Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 08/899,670

[22] Filed: Jul. 24, 1997

Related U.S. Application Data

[62] Division of application No. 08/661,258, Jun. 10, 1996, Pat. No. 5,686,334.

[51] Int. Cl.[7] .................................................. H01L 27/108
[52] U.S. Cl. .............................. 257/67; 257/69; 365/156
[58] Field of Search ........................... 257/67, 69, 368, 257/369, 351; 365/156

[56] References Cited

U.S. PATENT DOCUMENTS

| | | | |
|---|---|---|---|
| 4,980,732 | 12/1990 | Okazawa | 357/23.5 |
| 5,151,374 | 9/1992 | Wu | 437/40 |
| 5,491,654 | 2/1996 | Azuma | 365/156 |
| 5,506,436 | 4/1996 | Hayashi et al. | 257/351 |
| 5,640,342 | 6/1997 | Gonzales | 365/156 |

*Primary Examiner*—Olik Chaudhuri
*Assistant Examiner*—Douglas A. Wille
*Attorney, Agent, or Firm*—George O. Saile; Rosemary L. S. Pike; Graham S. Jones, II

[57] ABSTRACT

A TFT formed on a semiconductor substrate of a first conductivity type, includes a first doped portion of a polysilicon layer over FOX regions and a first insulating layer. A buried contact extends through the first portion of a polysilicon layer and the first insulating layer to the surface of the substrate adjacent to a FOX region. A second doped portion of the polysilicon layer overlies the first portion and forms a buried contact between the second portion and the substrate. The polysilicon layer forms a gate electrode and a conductor from the buried contact. Doped source/drain regions in the substrate are juxtaposed with the gate electrode. An interelectrode dielectric layer over the gate electrode and the conductor has a gate opening therethrough down to the substrate. A gate oxide layer is formed on the surface of the substrate at the gate opening. A semiconductor film extends over the interelectrode dielectric layer and over the surface of the substrate through the gate opening. A doped channel region is formed between source/drain regions in the semiconductor film above the gate opening, and above the gate opening of a TFT, with the doped region therebelow comprising the gate of the TFT.

20 Claims, 6 Drawing Sheets

SRAM CELL WITH THIN FILM TRANSISTOR USING TWO POLYSILICON LAYERS

This application is a division of application Ser. No. 08/661,258 filed Jun. 10, 1996 now U.S. Pat. No. 5,686,334.

BACKGROUND OF THE INVENTION

1. Field of the Invention

This invention relates to semiconductor memory devices and more particularly to the structures of SRAM (Static Random Access Memory) semiconductor memory devices.

2. Description of Related Art

In VLSI semiconductor circuits memories are formed of semiconductor devices, which store data by means of electric charges. Different types of such memories include Static Random Access Memories (SRAM's), Dynamic Random Access Memories (SRAM's), Read Only Memories (ROMs), etc. These semiconductor memory devices can be packed in very large numbers of memory cells with a large storage capacity in a space with very low volume and can be manufactured at a low cost. Among these memories, the static type semiconductor memory has been widely used as a random access memory (RAM), because it can retain stored data without periodically being refreshed during operation.

The static random access memory (SRAM) can be implemented by a large number of bistable flip-flop circuits each of which stores one bit of information. The CMOS flip-flop circuit is composed of a pair of N-channel MOS field effect transistors and a pair of P-channel MOS Field effect transistors used as a memory cell because of the very low power consumption of the CMOS flip-flop circuit. However, the CMOS flip-flop circuit generally requires a relatively large surface area on a semiconductor substrate, so in the past, there has been a limitation to the capacity of an SRAM by employing the CMOS flip-flop.

Several years ago, a design was adopted in which the cell includes a partial substitution of thin film transistors (TFTs) for the buried FET devices of a pair of P-channel MOS transistors of the CMOS flip-flop circuit in a Silicon-On-Insulator (SOI) structure. According to the TFT or SOI technique, the N channel MOS transistors are formed at a surface of a semiconductor substrate and the P-channel MOS transistors have been fabricated by a polycrystalline silicon layer or a monocrystalline silicon layer which is formed on the surface of the semiconductor substrate over an insulating layer. According to this technique, the P-channel transistors can overlap a part of the N-channel MOS transistors, and therefore the space required by each cell of an SRAM is reduced.

To implement a polysilicon Thin Film Transistor (TFT), with an active load element, typically it is necessary to use three polysilicon layers or four polysilicon layers. Even an SRAM cell with two polysilicon layers and a TFT requires a metal contact to complete the cross-coupling connection lines required for an SRAM circuit.

SUMMARY OF THE INVENTION

The present invention uses a gate (in a diffused substrate region with a buried contact thereto) below the TFT to overcome the problems described above.

In accordance with this invention a buried contact is included to from the cross-coupling connection lines in an SRAM cell with thin film transistor using two polysilicon layers.

In accordance with an aspect of this invention, a thin film field effect transistor circuit is formed on a semiconductor substrate of a first conductivity type, the substrate having a surface. Field oxide regions are formed on portions of the surface of the substrate and a first insulating layer on the surface of the semiconductor substrate between the field oxide regions on the semiconductor substrate. A first portion of a polysilicon layer over the field oxide regions and the first insulating layer. A buried contact opening is formed through the first portion of a polysilicon layer and the first insulating layer to the surface of the substrate adjacent to one of the field oxide regions exposing a portion of the surface of the semiconductor substrate. A second portion of the polysilicon layer overlies the first portion of the polysilicon layer and extends down into contact with the portion of the surface of the substrate forming a buried contact between the second portion and the surface of the substrate. The polysilicon layer includes the first portion and the second portion which are doped to form conductors. The polysilicon layer is patterned into a control gate electrode and a conductor from the buried contact. Doped source/drain regions in the substrate are juxtaposed with the control gate electrode. An interelectrode dielectric layer overlies the control gate electrode and the conductor. The interelectrode dielectric layer has a gate opening therethrough down to the surface of the substrate. A gate oxide layer on the surface of the substrate through the gate opening. A semiconductor film is formed over the interelectrode dielectric layer and the surface of the substrate through the gate opening. Doped channel region between source/drain regions are formed in the semiconductor film above the gate opening, and above the gate opening of a thin film transistor, with the doped region therebelow comprising the control gate of the thin film transistor.

Preferably, a layer of tungsten silicide is formed over the second portion of the polysilicon layer. The interelectrode dielectric layer comprises an interpolysilicon oxide. The semiconductor layer is formed of a doped polycrystalline silicon layer. The channel of the thin film transistor is an N type and the source/drain regions conductivity type is an N type. The buried contact is connected to the conductor to a control gate electrode of another transistor.

In accordance with another aspect of this invention, a thin film field effect transistor SRAM device on a semiconductor substrate of a first conductivity type, the substrate having a surface. There are field oxide regions on portions of the surface of the substrate and a first insulating layer on the surface of the semiconductor substrate between the field oxide regions on the semiconductor substrate. A first portion of a polysilicon layer is formed over the field oxide regions and the first insulating layer. A burled contact opening exists through the first portion of a polysilicon layer and the first insulating layer to the surface of the substrate adjacent to one of the field oxide regions exposing a portion of the surface of the semiconductor substrate. A second portion of the polysilicon layer over the first portion of the polysilicon layer and over the portion of the surface of the substrate forming a buried contact between the second portion and the surface of the substrate. The polysilicon layer includes the first portion and the second portion being doped. The polysilicon layer is patterned into a control gate electrode and a conductor from the buried contact. There are doped source/drain regions in the substrate juxtaposed with the control gate electrode. An interelectrode dielectric layer overlies the control gate electrode and the conductor. The interelectrode dielectric layer has a gate opening therethrough down to the surface of the substrate. A gate oxide layer is formed on the surface of the substrate through the gate opening. A semiconductor film overlies the interelectrode dielectric layer and the surface of the substrate, extending through the gate opening. There is a doped channel region between source/drain regions in the semiconductor film above the gate opening, and above the gate opening of a thin film transistor, with the doped region therebelow comprising the control gate of the thin film transistor.

Preferably, a layer of tungsten silicide is formed over the second portion of the polysilicon layer; interelectrode dielectric layer comprises an interpolysilicon oxide; the semiconductor layer is formed of a doped polycrystalline silicon layer; the channel of the thin film transistor is an N type and the source/drain regions conductivity type is an N type. The buried contact is connected to the conductor to a control gate electrode of another transistor.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
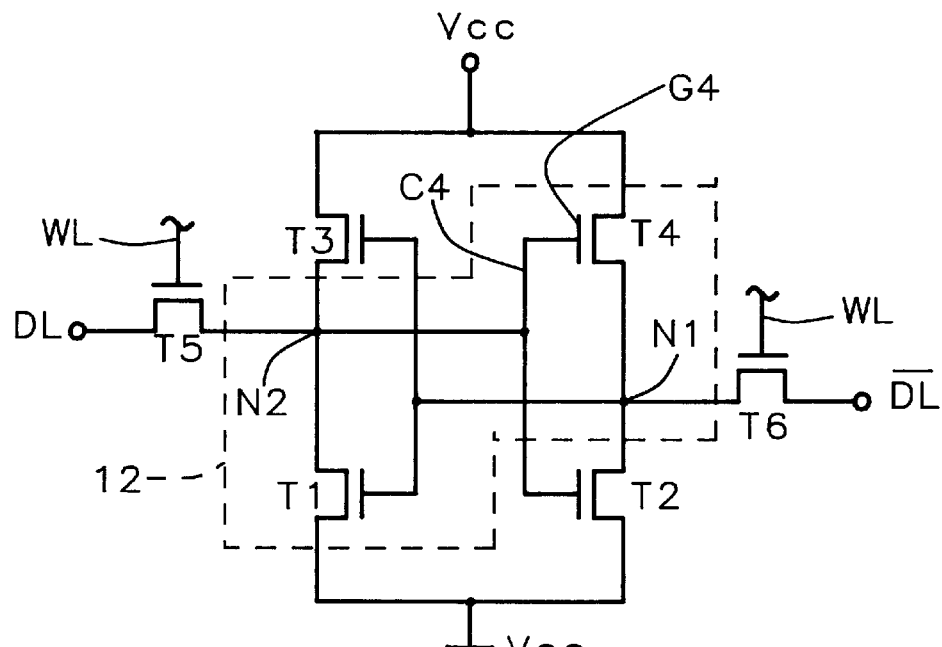
FIG. 1 shows an electrical schematic circuit diagram of a CMOS type Static Random Access Memory device in accordance with this invention.

FIG. 1 shows an electrical schematic circuit diagram of a CMOS type Static Random Access Memory (SRAM) device in accordance with this invention. In FIG. 1, N-channel MOS pass transistors T1 and T2 and P-channel MOS drive transistors T3 and T4 form a CMOS flip-flop circuit in which the transistors T3 and T1 have control gate electrodes electrically connected to node N1 to form a first CMOS inverter and the transistors T4 and T2 have control gate electrodes electrically connected to node N2 forming a second CMOS inverter. Nodes N1 and N2 of the first and second CMOS inverters are connected to a pair of digit lines DL and DL(bar) via a pair of N-channel transfer gate transistors T5 and T6 having their control gate electrodes controlled by a word line WL respectively.

Figure 2:
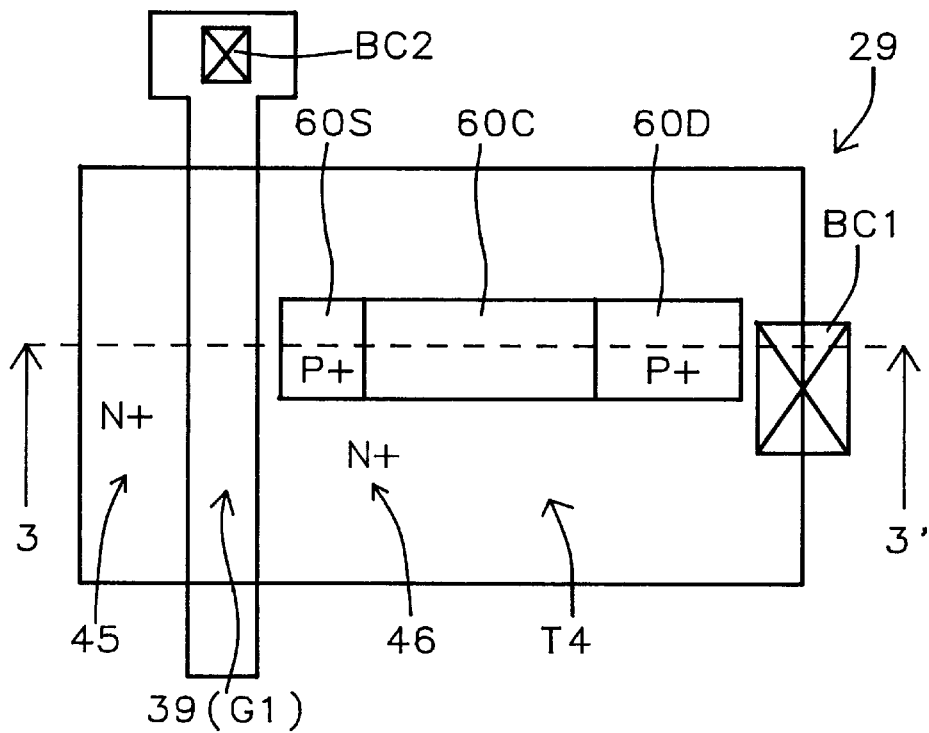
FIG. 2 is a plan view of a transistor in accordance with this invention of a MOSFET device formed on a silicon substrate.
Figure 3A:
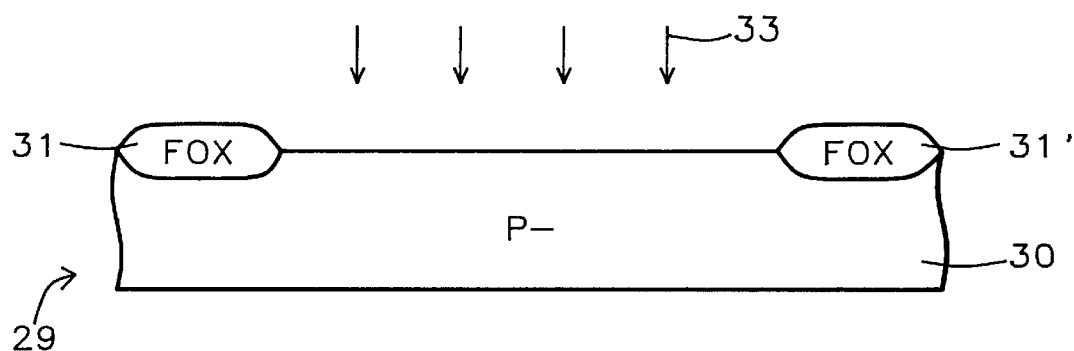
FIGS. 3A–3N show a sectional view taken along line 3–3' in FIG. 2 of the process of manufacture of transistors in accordance with this invention.
Figure 3B:
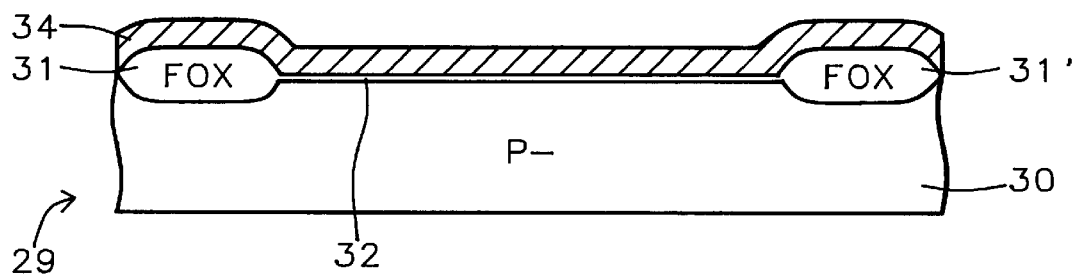
Figure 3C:
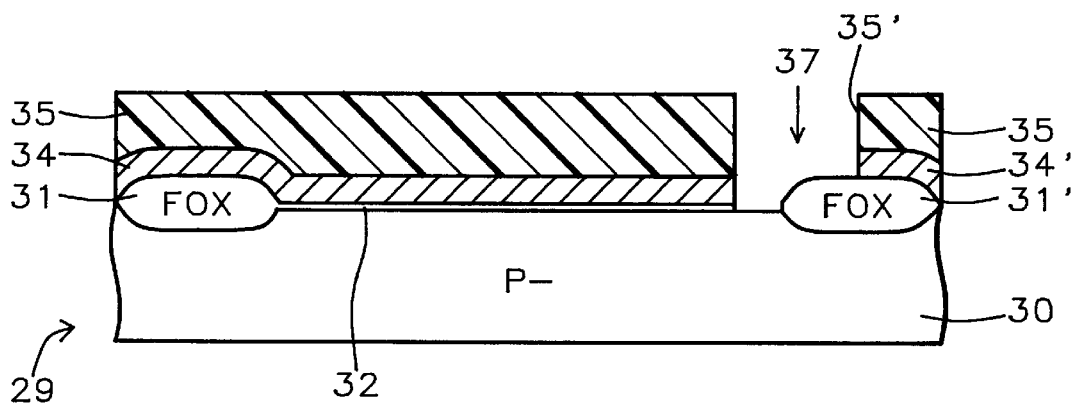
Figure 3D:
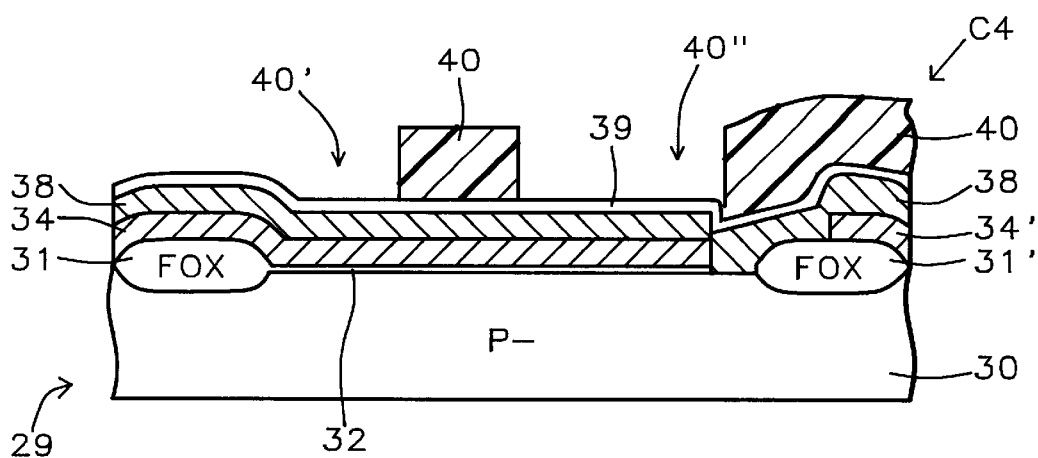
Figure 3E:
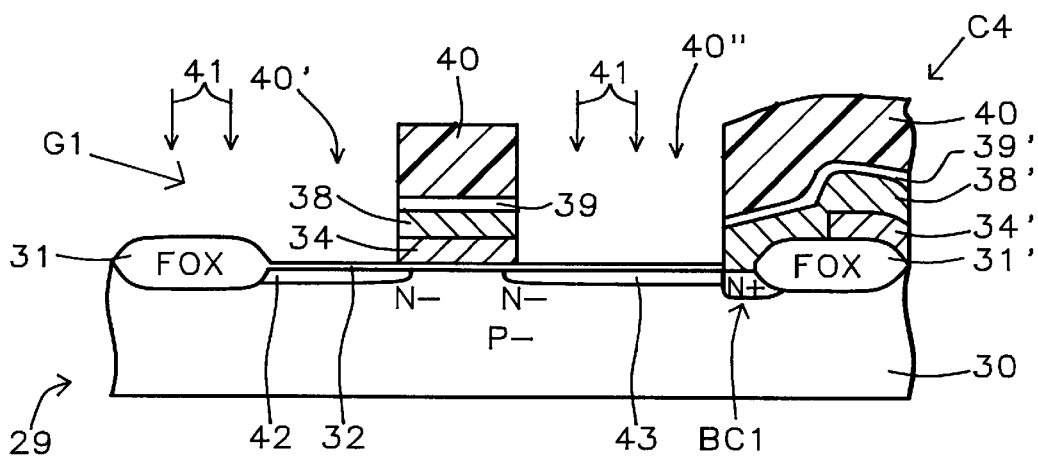
Figure 3F:
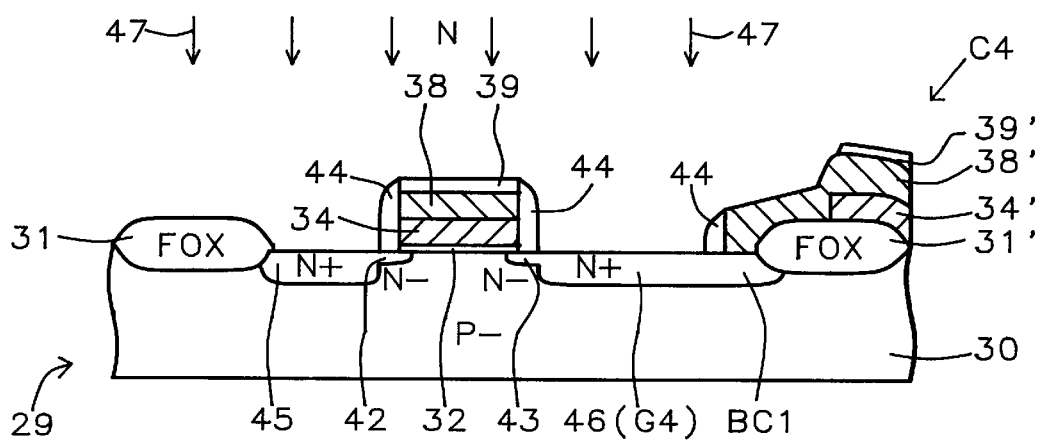
Figure 3G:
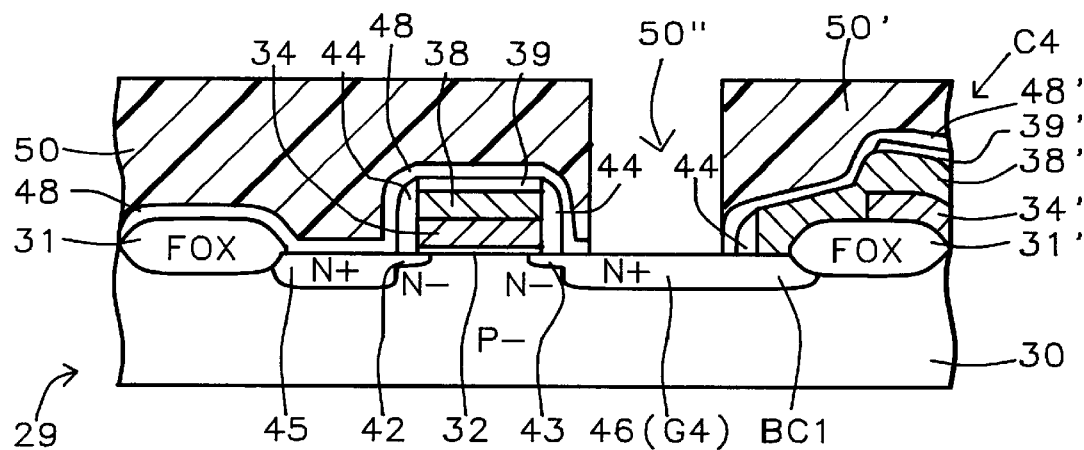
Figure 3H:
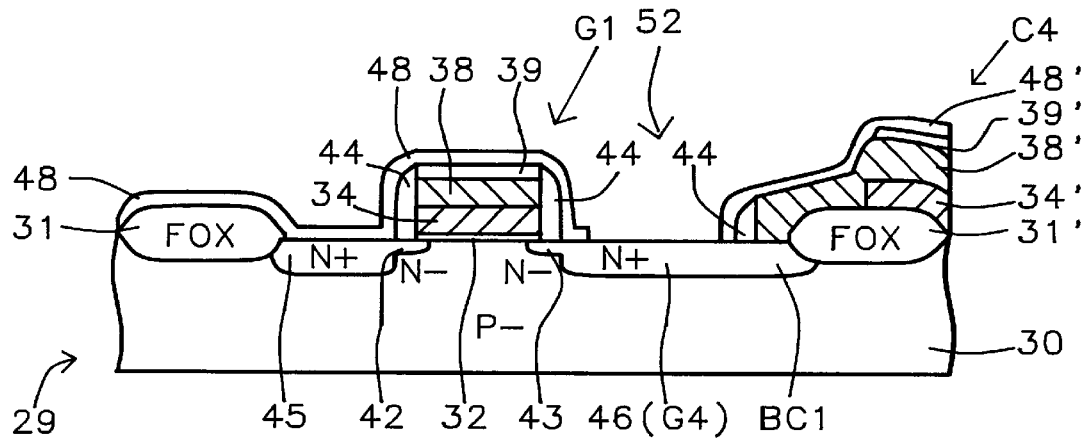
Figure 3I:
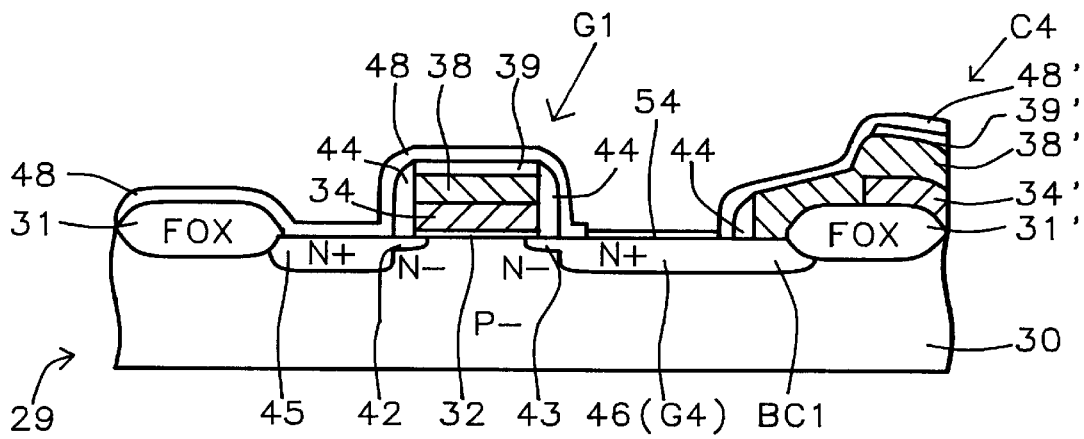
Figure 3J:
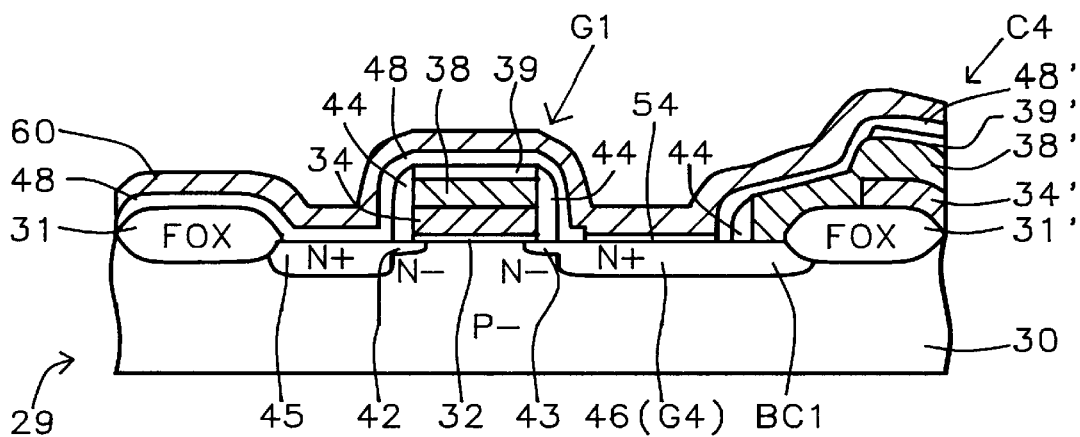
Figure 3K:
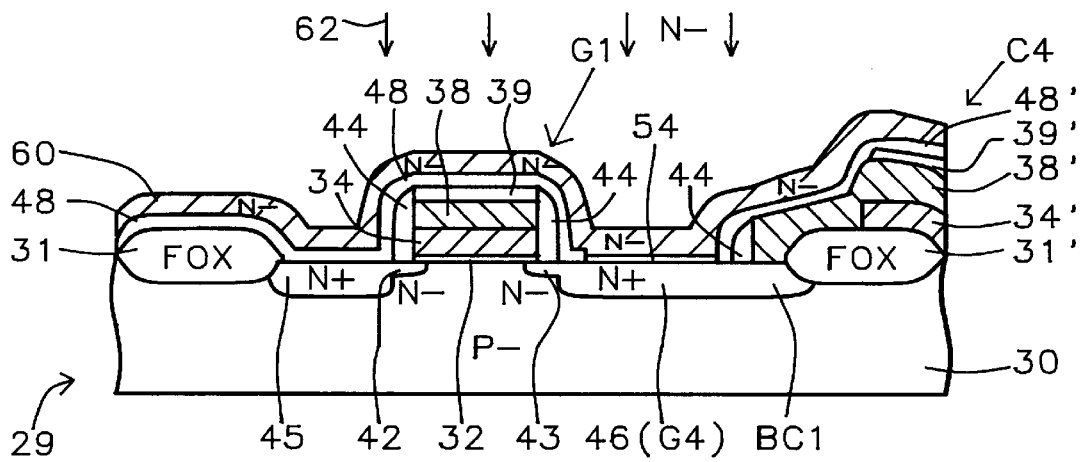
Figure 3L:
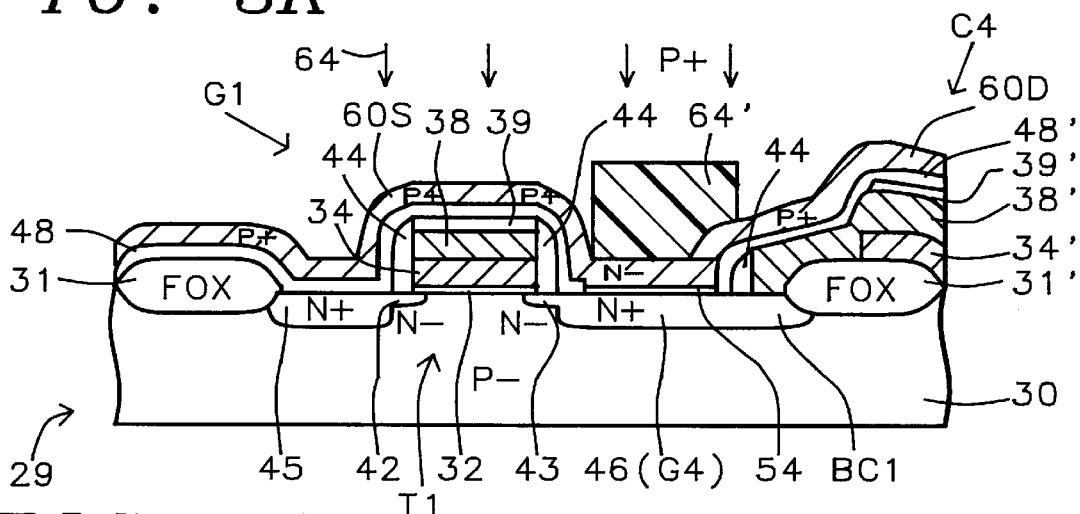
Figure 3M:
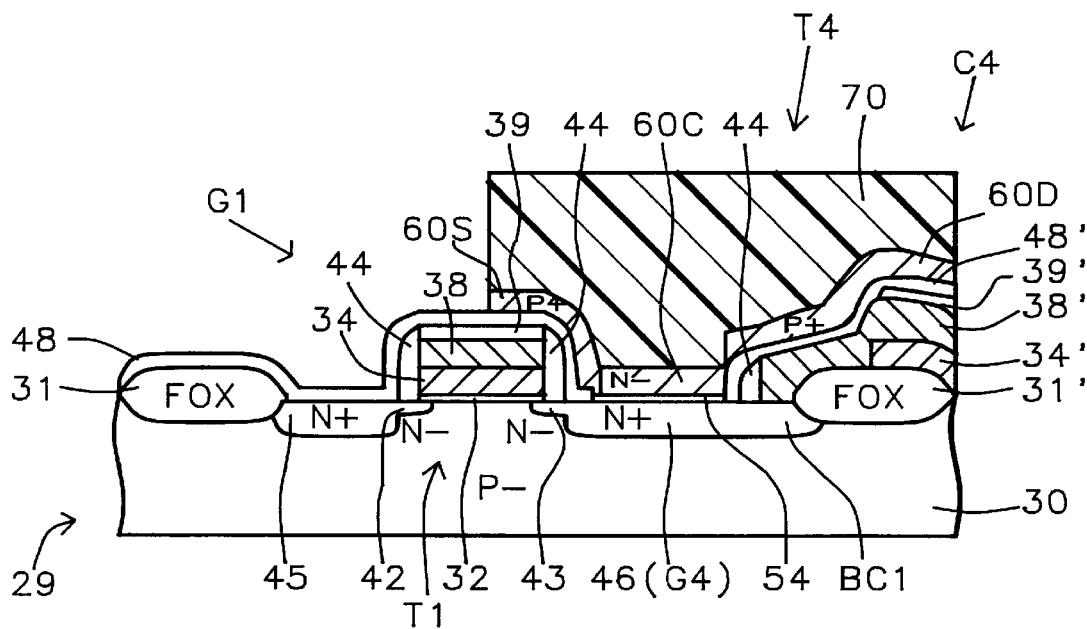
Figure 3N:
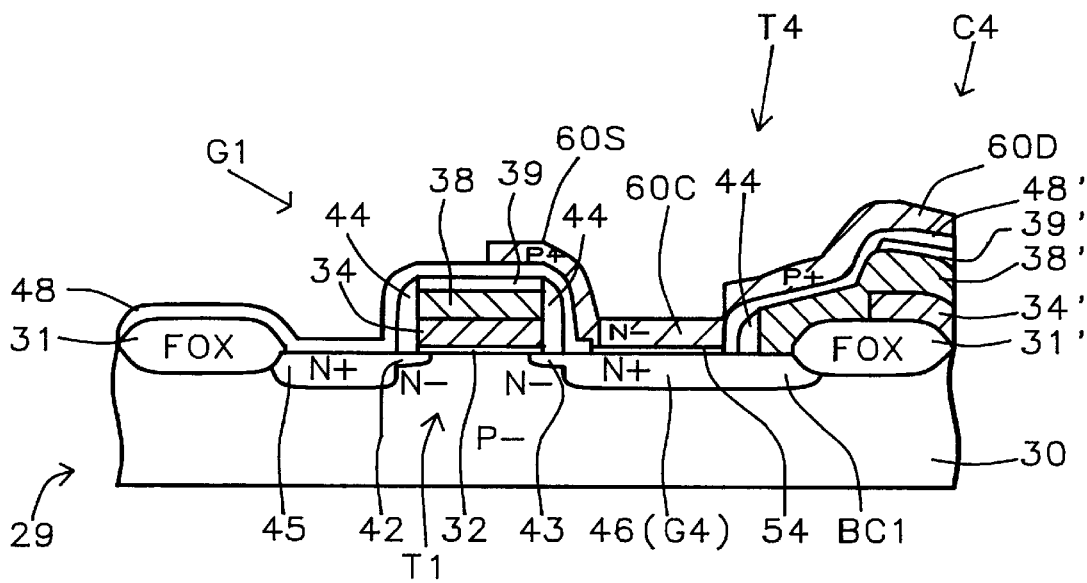

In this invention, the transistor T1 is a MOSFET device formed on a doped silicon substrate 30 as shown in FIG. 3N. An FET device 29 in accordance with this invention is shown in a plan view in FIG. 2.

FIGS. 3A–3N show sectional views of a sequence of steps in the process of manufacture of a device in accordance with this invention including the transistors T1 and T4. FIGS. 3A–3N show sectional views taken along line 3–3' in FIG. 2. The transistor T4 is a TFT device which is formed with the channel above the substrate in a polysilicon film 60 as seen in FIG. 3N.

In FIG. 2 the TFT transistor T4, which is located between buried contact BC1 and conductor line 39 (gate G1 of transistor T1), includes source 60S, channel 60C, and drain 60D (formed from a doped semiconductor film formed over an interelectrode dielectric layer), as well as a buried contact BC1 which is connected (FIG. 3N) to the buried N+ doped control gate electrode 46 (gate G4) of TFT transistor T4.

Conductor 39 in FIG. 2 is both the control gate electrode G1 of FET transistor T1 (with source/drain regions 45, 46) and conductor 39 connects to the control gate of tranisistor T3 and connects to buried contact BC2. Line 39 is a provides a connection line to node N1 and the source/drain circuits of transistors T4 and T2.

FIG. 3A shows a sectional view of a device 29 in accordance with this invention in an early stage of manufacture after the formation of two field oxidation (FOX) regions 31 on either end of a portion of the surface of P– doped semiconductor substrate 30.

A Vt ion implantation with ions 33 is performed into P– substrate 30. The concentration of dopant 33 is from about $10^{16}$ atoms/cm$^3$ to about $10^{17}$ atoms/cm$^3$ with boron (B11) dopant implanted.

FIG. 3B shows the device 29 of FIG. 3A after deposition of two layers. The first is gate oxide layer 32 deposited on the surface of P– doped substrate 30 between the FOX regions 31 and 31'.

In the next step polysilicon is deposited to form an undoped first polysilicon layer 34 (known in the industry as poly 1-1) of first polysilicon layer (preferably about 500 Å thick, within a thickness range between about 300 Å and about 800 Å).

FIG. 3C shows the device 29 of FIG. 3B after forming an opening in the undoped first polysilicon layer 34 (poly 1-1) to form a buried contact region for buried contact BC1 by patterning with mask 35 having opening 35' and etching through the opening 35' to form an opening 37 down to substrate 30 to the left of FOX region 31' by removing the exposed region of undoped first polysilicon portion 34 and the underlying region of gate oxide layer 32 down to the surface of substrate 30. In addition, the etching step removes the exposed surface of FOX region 31' below opening 35'. That surface is partially etched away during the time required to remove the thickness of the thinner gate oxide layer 32 in opening 37. The opening 37 down to the surface of layer 30 permits the formation of the buried contact BC1 as shown in FIG. 3E by the steps shown in FIGS. 3D and 3E.

Next, the photoresist mask 35 is removed from the device 29 of FIG. 3C at the end of the step shown in FIG. 3C.

FIG. 3D shows the device 29 of FIG. 3C after depositing a second polysilicon portion 38 of first polysilicon layer (known in the industry as poly 1-2) having a thickness between about 1,000 Å thick and about 1,500 Å. Portion 38 comprises a second thickness of polysilicon above first polysilicon portion 34. The polysilicon layer 38 reaches down through the opening 37 in first polysilicon portion 34 made by mask opening 35' into direct contact with the substrate 30 and the exposed surface of FOX region 31'.

The next step is to dope all of the first polysilicon layer including first polysilicon layer 34 and polysilicon layer 38 (both poly 1-1 and poly 1-2) using either:

1) POCl$_3$ (typical temperature of about 850° C.) or
2) Ion implantation (typical parameters of 50 keV and 5E15 ions/cm$^2$).

Then a tungsten silicide layer 39 is deposited on the top surface of layer 38 on device 29 (with a thickness from about 1,500 Å to about 2,000 Å.

Next device 29 is covered with a photoresist mask 40 above tungsten silicide layer 39. The mask 40 has openings 40' and 40" therethrough which are to be used to define the patterns of the gate and conductor seen in FIG. 3E.

FIG. 3E shows the device 29 of FIG. 3D after etching through the openings 40' and 40" through photoresist mask 40 to pattern layers 34 and 38 to form a conductor 34', 38', 39' and control gate electrode G1 of transistor T1.

Next, the layers 34 and 38 are etched away through openings 40', 40" through mask 40, as shown in FIG. 3E. The result is the new gate electrode G1 formed of layers 34, 38 and 39 between the FOX regions 31 and 31' and the new conductor C4 formed of layers 34', 38' and 39' above FOX region 31'.

FIG. 3E shows the device 29 of FIG. 3D during formation of source/drain (S/D) lightly doped N– by ion implanting dopant 40' through openings 42', 43' into regions 42 and 43 in the surface of substrate 30. Region 42 is located between the new gate electrode G1 and the FOX region 31. Region 43 is located between the new gate electrode G1 and the FOX region 31' as shown in FIG. 3E. The concentration of dopant 40' in lightly doped N– regions 42 and 43 is from about $10^{17}$ atoms/cm$^3$ to about $10^{18}$ atoms/cm$^3$.

The buried contact region BC1 is shown extending from region 43 under layer 38' to the lower surface of FOX region 31'. The region BC1 is formed by the conventional step of out-diffusion of dopant from polysilicon layer 38'.

Next in FIG. 3F, spacers 44 of silicon dioxide are formed in a conventional process of blanket deposition followed by etching back the blanket spacer layer to leave spacers 44 adjacent to the control gate G1. In addition, is a spacer 44 adjacent to the layer 38' of conductor C4.

The following step as shown in FIG. 3F is to form S/D N+ doped regions by ion implanting dopant 47 into regions 45, 46 (gate G4) between the new gate electrode G1 and the FOX regions 31, 31' as shown in FIG. 3E. The concentration of dopant 47 in regions 45 and 46 (gate G4) is from about $10^{20}$ atoms/cm$^3$ to about $10^{21}$ atoms/cm$^3$.

Thereafter, a step is performed of doping with ions of P++ which is not shown since it is not in regions illustrated in the drawings pertinent to this invention.)

FIG. 3G shows the device 29 of FIG. 3F after depositing an InterPolysilicon Oxide (IPO) silicon dioxide layer 48' which comprises an interconductor dielectric layer for separating the polysilicon layer (34, 38, 39, 34', 38', 39') from the polysilicon film 60. The IPO silicon dioxide layer 48' is formed preferably by a PEOX (Plasma Enhanced Oxide) process of decomposition of TEOS (tetraethylorthosilicate).

In addition a mask 50, 50' has been formed over IPO interconductor dielectric layer 48, 48' with an opening 50" over the gate oxide opening to be formed above the gate electrode G4 for the TFT transistor T4.

FIG. 3H shows the device 29 of FIG. 3G after an opening has been made in the layer 48, 48' below the opening 50' exposing the surface of semiconductor 30, so the TFT gate area 52 has been defined as seen in FIG. 3H above gate electrode region 46 (G4).

FIG. 3I shows the device 29 of FIG. 3H after depositing a conventional gate oxide (silicon dioxide) layer 54 above the N+ region 46 (G4) in the opening made in FIG. 3G. Layer 54 has a thickness from about 200 Å and about 400 Å. The IPO interconductor dielectric layer 48, 48' covers the exposed surfaces of second polysilicon layer 38, 38, conductor line 39, 39', and portions of drain region 46 (G4) aside from the opening 50".

FIG. 3J shows the device 29 of FIG. 3I after depositing a thin film polysilicon layer 60 to form the source/drain and channel of thin film transistor T4. The thin film polysilicon layer 60 is deposited upon the surface of IPO interconductor dielectric layer 48, 48' and second gate oxide layer 54 and is separated from the drain region 46(G4) by second gate oxide layer 54 and IPO interconductor dielectric layer 48, 48'.

FIG. 3K shows the device 29 of FIG. 3J with the layer 60 being doped in situ with N– dopant by ion implantation with a concentration of phosphorus (P) or arsenic (As) dopant 47 in regions 45 and 46 (gate G4) from about $10^{16}$ atoms/cm$^3$ to about $10^{17}$ atoms/cm$^3$.

FIG. 3L shows the device 29 of FIG. 3K with the source region 60S and drain region 60D of layer 60 being doped with P+ dopant by ion implantation with a concentration of dopant 64 except for channel regions 54 above gate G4 which is protected by a mask 64' thereabove. The dopant comprises BF$_2$ dopant with a concentration of from about $10^{19}$ atoms/cm$^3$ to about $10^{20}$ atoms/cm$^3$.

In FIG. 3M the device 29 of FIG. 3L is shown after a mask has been placed over the TFT device T4 to protect the channel region 60C and S/D regions 60S and 60D during the etching away of the unwanted portions of the layer 60 by conventional etching techniques.

Conventional backend flow is performed to complete contacts and metal.

In FIG. 3N the device 29 of FIG. 3M is shown after the mask 70 has been removed in the completed form of the device 29 of FIGS. 1 and 2.

Process Steps

The process flow for the process of this invention comprises as follows:

1. Form a conventional set of wells (not shown) in substrate 30 for CMOS devices.
2. Define active regions in substrate 30 and wells (not shown).
3. Form field oxidation regions 31 in FIG. 3A.
4. Perform a Vt implant region 33 in FIG. 3A by I/I with boron ions in a concentration from about $10^{16}$ atoms/cm$^3$ to about $10^{17}$ atoms/cm$^3$.
5. Deposit gate oxide layer 32 in FIG. 3B.
6. Deposit undoped first polysilicon layer 34 (known in the industry as poly 1-1) of laminated polysilicon layers (preferably about 500 Å thick, but a maximum thickness range between about 300 Å and about 800 Å).
7. Form opening in (layer 34) to form a buried contact region for buried contact BC1 by patterning with mask 35 having opening 35' and etching.
8. Deposit (poly 1-2) which is the second polysilicon layer 38 of first polysilicon layer (known in the industry as poly 1-2) with a thickness range between about 1,000 Å thick and about 1,500 Å thick.

Then dope all of the laminated polysilicon layers including first polysilicon layer 34 and polysilicon layer 38 (both poly 1-1 and poly 1-2) using either
   1) POCl$_3$ (typical temperature of about 850° C.) or
   2) Ion implantation (typical parameters of 50 keV and 5E15 ions/cm$^2$).
9. Deposit tungsten silicide (within a thickness range between about 1,500 Å thick and about 2,000 Å thick)
10. Gate definition (pattern and etch).
11. Form S/D regions N– regions 42, 43, spacers , N+ regions 45,46 (gate G4) and (P++ regions which are not shown since it is not in regions illustrated in the drawings pertinent to this invention).
12. (FIG. 3G) Deposit InterPolysilicon Oxide (IPO) silicon dioxide layer 48, 48' which comprises an interconductor dielectric layer for separating the polysilicon layer (34, 38, 39, 39') from the polysilicon film 60. The IPO silicon dioxide layer 48 is formed preferably by a PEOX (Plasma Enhanced Oxide) process of decomposition of TEOS (tetraethylorthosilicate).
13. (FIGS. 3G & 3H) TFT gate area definition.

14. (FIG. 3I) Deposit gate dielectric layer 54 for TFT device T4.
15. (FIG. 3J) Deposit polysilicon film 60.
16. (FIG. 3K) In situ N− ion implant doping of film 60.
17. (FIG. 3L) P+ S/D ion implant doping of regions 60S and 60D as well as other regions aside from the channel 60C of TFT transistor T4. The dopant comprises $BF_2$ dopant with a concentration of from about $10^{19}$ atoms/cm$^3$ to about $10^{20}$ atoms/cm$^3$.

Then define TFT device by patterning and etching.
18. Conventional backend flow to complete contacts and metal.

SUMMARY

By including the first buried contact BC1 the advantages are achieved as follows:

1. Reduction in number of polysilicon layers.
2. Current double polysilicon SRAM process may be used with very little modification.

A CMOS SRAM latch is provided with thin-polysilicon transistors in two levels of polysilicon. In this method, use is made of a buried contact structure to form the cross-coupled latch. The process also uses N+ in the substrate to form the gate of the TFT with a buried contact to cross-couple the latch.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A thin film field effect transistor circuit on a doped silicon semiconductor substrate of a first conductivity type, said doped silicon semiconductor substrate having a surface; said transistor circuit comprising as follows:

field oxide regions (31') on portions of said surface of said doped silicon semiconductor substrate (30) and a first insulating layer (32) on said surface of said doped silicon semiconductor substrate (30) between said field oxide region (31, 31') on said doped silicon semiconductor substrate (30);

a first polysilicon layer (34, 34') formed only over said field oxide regions (31') and said first insulating layer 32, a buried contact opening (37) through said first polysilicon layer (34, 34') and said first gate oxide layer (32) to said surface of said doped silicon semiconductor substrate adjacent to one of said field oxide regions exposing a contact portion of said surface of said doped silicon semiconductor substrate (30), a second polysilicon layer (38, 38') formed over said first polysilicon layer (34, 34') with a patterned separate contact portion of said second polysilicon layer (38') located over said contact portion of said surface of said doped silicon semiconductor substrate extending through said buried contact opening (37) to form a buried contact (BC1) between said second polysilicon layer (34, 34') and said surface of said doped silicon semiconductor substrate (30), said first polysilicon layer (34) and said second polysilicon layer (38) being doped and being patterned into a first control gate electrode (G1) and said second polysilicon layer also being patterned into a conductor from said buried contact opening (37) and reaching through said first polysilicon layer from said buried contact, said gate electrode (G1) including a conductor line (39, 39') comprising a tungsten silicide layer formed over said second polysilicon layer (38, 38'), doped first source/drain regions (45, 46) of a first transistor formed in said doped silicon semiconductor substrate juxtaposed with said first control gate electrode with one (46) of said first source/drain regions (45, 46) formed below said buried contact opening (37) with said drain region (46) also being juxtaposed with said buried contact (BC1), an interelectrode dielectric layer (48, 48') over said first control gate electrode (G1) and said conductor line (39, 39'), said interelectrode dielectric layer (48) having a gate opening (52) therethrough down to said surface of said doped silicon semiconductor substrate within said buried contact opening (37), a second gate oxide layer (54) on said surface of said drain region (46) in said doped silicon semiconductor substrate (30) extending through said gate opening (52), a semiconductor film (60) formed over said interelectrode dielectric layer (48) and formed over said surface of said second gate oxide layer (52) and extending through said gate opening (52) through said interelectrode dielectric layer (48), a doped channel region (60C) formed in said semiconductor film (60) between second source/drain regions (60S, 60D) formed in said semiconductor film (60) above and aside from said gate opening (52) of a thin film transistor (T4) above said second gate oxide layer (54), with the doped drain region (46) below said second gate oxide layer (54) comprising a second control gate (46(G4)) of said thin film transistor (T4), and said second gate oxide layer (54) and said interelectrode dielectric layer (48, 48') separating said semiconductor film (60) from said drain region (46), said second polysilicon layer (38, 38') and said conductor line (39, 39').

2. A device according to claim 1, in which a layer of tungsten silicide is formed over said second polysilicon layer.

3. A device according to claim 1, wherein said interelectrode dielectric layer comprises an interpolysilicon oxide.

4. A device according to claim 1, in which said semiconductor film is formed of a doped polycrystalline silicon film.

5. A device according to claim 1, in which said channel of said thin film transistor is an N type, said second source/drain regions conductivity type of said thin film transistor is a P type and said first source/drain regions of said first transistor conductivity type is an N type.

6. A device according to claim 1, wherein said buried contact is connected to said conductor to a control gate electrode of another transistor.

7. A device according to claim 1, wherein:

a layer of tungsten silicide is formed over said second polysilicon layer, and said interelectrode dielectric layer comprises an interpolysilicon oxide.

8. A device according to claim 7, wherein:

a layer of tungsten silicide is formed over said second polysilicon layer, said interelectrode dielectric layer comprises an interpolysilicon oxide, and in which said semiconductor film is formed of a doped polycrystalline silicon film.

9. A device according to claim 8, wherein:

a layer of tungsten silicide is formed over said second polysilicon layer, said interelectrode dielectric layer comprises an interpolysilicon oxide, in which said semiconductor film is formed of a doped polycrystalline silicon film, and in which said channel of said thin film transistor is an N type, said second source/drain regions conductivity type is a P type and said first source/drain regions conductivity type is an N type.

10. A device according to claim 9, wherein:

a layer of tungsten silicide is formed over said second polysilicon layer, said interelectrode dielectric layer comprises an interpolysilicon oxide, in which said semiconductor film is formed of a doped polycrystalline silicon film, in which said channel of said thin film transistor is an N type, said second source/drain regions conductivity type is a P type and said first source/drain regions conductivity type is an N type, and said buried contact is connected to said conductor to a control gate electrode of another transistor.

11. A thin film field effect transistor SRAM device on a doped silicon semiconductor substrate (30) of a first conductivity type, said doped silicon semiconductor substrate (30) having a surface; said transistor SRAM device comprising as follows:

field oxide regions (31, 31') on portions of said surface of said doped silicon semiconductor substrate (30) and a first insulating layer (32) on said surface of said doped silicon semiconductor substrate (30) between said field oxide regions (31, 31') on said doped silicon semiconductor substrate (30);

a first polysilicon layer (34, 34') with a first thickness formed only over one of said field oxide regions (31') and over said first insulating layer (32), a buried contact opening (37) through said first polysilicon layer (34, 34') and said first insulating layer (32) to said surface of said doped silicon semiconductor substrate (30) adjacent to one of said field oxide regions (31') exposing a contact portion of said surface of said doped silicon semiconductor substrate (30), a second polysilicon layer (38, 38') with a second thickness formed over said first polysilicon layer (34, 34') with a separate contact portion of said second polysilicon layer (38') patterned to extend into contact with said contact portion of said surface of said doped silicon semiconductor substrate (30) extending through said buried contact opening (37) to form a buried contact (BC1) between said second polysilicon layer (38, 38') and a first doped drain region (46) in said surface of said doped silicon semiconductor substrate (30), a tungsten silicide layer (39, 39') formed into a tungsten silicide conductor line over said second polysilicon layer (38, 38'), said polysilicon layers including said first polysilicon layer and said second polysilicon layer being doped, said tungsten silicide conductor line (39) and said first polysilicon layer (34) and said second polysilicon layer (38) patterned into a first control gate electrode, said second polysilicon layer (38') patterned into a conductor reaching down across said first polysilicon layer (34') and across one of said field oxide regions (34') down into direct contact with said buried contact (BC1), a doped first source region (45) and said doped first drain region (46) comprising components of a first transistor (T1) in said doped silicon semiconductor substrate (30) juxtaposed with said first control gate electrode (G1) with said drain region (46) of said first source/drain regions (45, 46) formed below said buried contact opening (37) with said drain region (46) being juxtaposed with said buried contact (BC1), an interelectrode dielectric layer (48, 48') formed over said first control gate electrode (G1) including said conductor, said interelectrode dielectric layer (48, 48') having a gate opening (52) therethrough down to said surface of a said first source/drain region in said doped silicon semiconductor substrate (30), a gate oxide layer (54) on said surface of said doped silicon semiconductor substrate extending through said gate opening (52) to cover a said first drain region (46) in said substrate, a semiconductor film (60) formed over said interelectrode dielectric layer (48) and formed over said gate oxide layer (54) above the surface of said substrate (30) extending down through said gate opening into close proximity to said first drain region (46) in said substrate and separated from said first drain region (46) by said gate oxide layer (54) and said interelectrode dielectric layer (48, 48'), second source/drain regions (60S, 60D) formed in said semiconductor film (60) aside from said gate opening (52), a doped second channel region (60C) between said second source/drain regions (60S, 60D) in said semiconductor film (60) above said gate opening (52), of a thin film transistor (T4), with said doped drain region (46) therebelow comprising a thin film transistor control gate of said thin film transistor (T4), and said gate oxide layer (54) and said interelectrode dielectric layer (48, 48') separating said semiconductor film (60, 60S, 60C, 60D) from said drain region (46(G4)), said second polysilicon layer (38, 38') and said tungsten silicide conductor line (39, 39').

12. A device according to claim 11 wherein:

said first polysilicon layer has a thickness from about 300 Å to about 800 Å, said second polysilicon layer has a thickness from about 1,000 Å to about 1,500 Å, and said layer of tungsten silicide formed over said second polysilicon layer has a thickness from about 1,500 Å to about 2,000 Å.

13. A device according to claim 11, wherein said interelectrode dielectric layer comprises an interpolysilicon oxide.

14. A device according to claim 11, in which said semiconductor film is formed of a doped polycrystalline silicon layer.

15. A device according to claim 11, in which said channel of said thin film transistor is an N type, said second source/drain regions conductivity type is a P type and said first source/drain regions conductivity type is an N type.

16. A device according to claim 11, wherein said buried contact is connected to said conductor to a control gate electrode of another transistor.

17. A device according to claim 11, wherein:
   said buried contact is connected to said conductor to a control gate electrode of another transistor,
   said interelectrode dielectric layer comprises an interpolysilicon oxide.

18. A device according to claim 11, wherein:
   said buried contact is connected to said conductor to a control gate electrode of another transistor,
   said interelectrode dielectric layer comprises an interpolysilicon oxide,
   said semiconductor film is formed of a doped polycrystalline silicon layer.

19. A device according to claim 11, wherein:
   said buried contact is connected to said conductor to a control gate electrode of another transistor,
   said interelectrode dielectric layer comprises an interpolysilicon oxide,
   said semiconductor film is formed of a doped polycrystalline silicon layer,
   said channel of said thin film transistor is an N type, said second source/drain regions conductivity type is a P type and said first source/drain regions conductivity type is an N type.

20. A thin film field effect transistor SRAM device formed on a doped silicon semiconductor substrate (30) of a first conductivity type, said doped silicon semiconductor substrate (30) having an upper surface; said transistor SRAM device comprising as follows:
   field oxide regions (31, 31') on portions of said upper surface of said doped silicon semiconductor substrate (30) and a first insulating layer (32) on said upper surface of said doped silicon semiconductor substrate (30) between said field oxide regions (31, 31') on said doped silicon semiconductor substrate (30);
   a first doped polysilicon layer (34, 34') with a first thickness formed only over one of said field oxide regions (31') and over said first insulating layer (32),
   a buried contact opening (37) through said first polysilicon layer (34, 34') and said first insulating layer (32) to said surface of said doped silicon semiconductor substrate (30) adjacent to one of said field oxide regions (31') exposing a contact portion of said surface of said doped silicon semiconductor substrate (30),
   a second doped polysilicon layer (38, 38') with a second thickness formed over said first polysilicon layer (34, 34')
   a tungsten silicide conductor line layer (39, 39') formed over said second polysilicon layer (38, 38'),
   said tungsten silicide conductor line layer (39) and said first polysilicon layer (34) and said second polysilicon layer (38) patterned into a first control gate electrode,
   said second polysilicon layer (38) patterned into a conductor reaching down across said first polysilicon layer (34') and across one of said field oxide regions (34') through said buried contact opening (37) down into direct contact with said contact portion to form a buried contact (BC1) between said second polysilicon layer (38, 38') and a first doped drain region (46) in said surface of said doped silicon semiconductor substrate (30) through said contact portion adjacent thereto,
   a doped first source region (45) and said doped first drain region (46) comprising components of a first transistor (T1) in said doped silicon semiconductor substrate (30) juxtaposed with said first control gate electrode (G1) with said drain region (46) of said first source/drain regions (45, 46) formed below said buried contact opening (37) and with said drain region (46) being juxtaposed with said buried contact (BC1),
   an interelectrode dielectric layer (48) formed over said first control gate electrode (G1) including said conductor,
   said interelectrode dielectric layer (48) having a gate opening (52) therethrough down to said surface of a said first doped drain region (46) in said doped silicon semiconductor substrate (30),
   a gate oxide layer (54) on said surface of said doped silicon semiconductor substrate extending through said gate opening (52) to cover a said first drain region (46) in said substrate,
   a semiconductor film (60) over said interelectrode dielectric layer (48) and said gate oxide layer (54) above the surface of said substrate (30) extending down through said gate opening into close proximity to said first drain region (46) in said substrate,
   second source/drain regions (60S, 60D) formed in said semiconductor film (60) aside from said gate opening (52),
   a doped second channel region (60C) between said second source/drain regions (60S, 60D) in said semiconductor film (60) above said gate opening (52), of a thin film transistor (T4), with the doped drain region (46) therebelow comprising a thin film transistor control gate of said thin film transistor (T4),
   said interelectrode dielectric layer comprises an interpolysilicon oxide,
   said semiconductor film is formed of a doped polycrystalline silicon layer,
   said channel of said thin film transistor is an N type, said second source/drain regions conductivity type is a P type and said first source/drain regions conductivity type is an N type,
   said buried contact is connected to said conductor to a control gate electrode of another transistor, and
   said gate oxide layer (54) and said interelectrode dielectric layer (48, 48') separating said semiconductor film (60, 60S, 60C, 60D) from said drain region (46(G4)), said second polysilicon layer (38, 38') and said tungsten silicide conductor line layer (39, 39').

* * * * *